United States Patent [19]

Fournier et al.

[11] Patent Number: 4,515,107
[45] Date of Patent: May 7, 1985

[54] APPARATUS FOR THE MANUFACTURE OF PHOTOVOLTAIC DEVICES

[75] Inventors: Eugene Fournier, Garden City; Joachim Doehler, Union Lake, both of Mich.

[73] Assignee: Sovonics Solar Systems, Solon, Ohio

[21] Appl. No.: 441,280

[22] Filed: Nov. 12, 1982

[51] Int. Cl.³ .............................................. C23C 13/10
[52] U.S. Cl. ..................................... 118/718; 118/719; 118/723; 118/724; 118/50.1; 343/771; 427/39; 427/45.1
[58] Field of Search ....................... 118/50.1, 723, 722, 118/718, 719, 733, 724; 427/39, 45.1; 422/186.04, 186.05, 186.29, 906, 907; 343/771

[56] References Cited

U.S. PATENT DOCUMENTS

| | | | |
|---|---|---|---|
| 4,226,898 | 10/1980 | Ovshinsky et al. | 427/39 |
| 4,265,730 | 5/1981 | Hirose et al. | 204/298 |
| 4,322,699 | 3/1982 | Hildebrand et al. | 343/771 X |
| 4,363,828 | 12/1982 | Brodsky et al. | 427/39 |
| 4,379,181 | 4/1983 | Cannella et al. | 427/39 |
| 4,401,054 | 8/1983 | Matsuo et al. | 427/45.1 X |
| 4,434,742 | 3/1984 | Henatt et al. | 118/723 |
| 4,438,723 | 3/1984 | Cannella et al. | 118/725 X |

FOREIGN PATENT DOCUMENTS

| | | | |
|---|---|---|---|
| 57-19567 | 4/1982 | Japan | |
| 2033355 | 5/1980 | United Kingdom | |

OTHER PUBLICATIONS

Mailhiot, C.; Currie, J. F.; Sapieha, S.; Wertheimer, M. R.; Yelon, A.; *Electrical and Compositional Heterogeneity of Amorphous Si:H Films*, Journal of Non-Crystalline Solids 35 & 36, pp. 207–212, (1980).

J. F. Currie, M. R. Wertheimer, A. Yelon, C. Brassard, J. Brebner, R. W. Cochrane & J. P. Hart, "Amorphous Hydrogenated Silicon for Photovoltaics", © 1981 by la Societe d'Energie Solaire du Canada Inc., pp. 101–104.

C. Brassard, R. Groleau, J. L'Ecuyer, J. P. Currie, P. Depelsenaire, M. Wertheimer & A. Yelon, "Nuclear Scattering Measurements of Composition Profiles in a-Si:H Multilayer Structures", Journal De Physique, Oct 1981, pp. C4-795–C4-799.

M. Aktik, J. F. Currie & A. Yelon, "Density of States in Amorphous Silicon Produced by Microwave Glow Discharge", J. Appl. Phys. 53(1), Jan. 1982, pp. 439–441.

C. Cohen, "Thin Si Films can Form at Room Temperature", Electronics, vol. 54, No. 22, (Nov. 3, 1981) pp. 82–84.

Sakudo et al., "Microwave Ion Source", Rev. Sci. Instruma., vol. 48, No. 7, Jul. 1977, pp. 762–766.

Brodsky et al., "Method of Preparing Hydrogenated Amphorphous Silicon", IBM Tech. Disclosure Bulletin, vol. 22, No 8A, Jan. 1980, pp. 3391–3392.

*Primary Examiner*—John D. Smith
*Assistant Examiner*—Bernard F. Plantz

[57] ABSTRACT

An apparatus for manufacturing photovoltaic devices of the type including a plurality of layers of semiconductor materials deposited onto a substrate includes a plurality of deposition chambers, each chamber arranged to deposit a respective one of the layers of semiconductor materials onto the substrate as the substrate is advanced therethrough. At least one of the deposition chambers is coupled to a source of microwave energy to form a microwave energy excited glow discharge plasma within the at least one deposition chamber for depositing at least one of the layers of semiconductor material onto the substrate from the microwave energy excited glow discharge plasma within the at least one deposition chamber.

Also disclosed is an assembly for depositing a material onto a substrate from a microwave energy excited plasma. The assembly includes a deposition chamber, a source of microwave energy, and an antenna extending into the chamber and coupled to the microwave energy source. The antenna includes an outer sheath formed from a conductive material, an inner conductor extending within and electrically insulated from the outer sheath, and a slot within the outer sheath. The assembly also includes a new and improved feed-through for the antenna permitting the antenna to extend into the chamber while establishing a vacuum seal between the chamber and the antenna.

22 Claims, 8 Drawing Figures

APPARATUS FOR THE MANUFACTURE OF PHOTOVOLTAIC DEVICES

FIELD OF THE INVENTION

This invention relates to a multiple deposition chamber apparatus for manufacturing large area amorphous semiconductor photovoltaic devices. The invention more particularly relates to such an apparatus wherein microwave energy is utilized in at least one of the deposition chambers for forming a glow discharge deposition plasma.

BACKGROUND OF THE INVENTION

This invention relates to an improved multiple deposition chamber apparatus for manufacturing photovoltaic devices wherein successive amorphous-silicon alloy semiconductor layers are continuously deposited on a substrate moving through the deposition chambers.

Recently, considerable efforts have been made to develop systems for depositing amorphous semiconductor alloys, each of which can encompass relatively large areas, and which can be doped to form p-type and n-type materials for the production of p-i-n and other type devices which are, in operation in photovoltaic and other applications, substantially equivalent to their crystalline counterparts.

It is now possible to prepare amorphous silicon alloys by glow discharge techniques that have (1) acceptable concentrations of localized states in the energy gaps thereof, and (2) provide high quality electronic properties. This technique is fully described in U.S. Pat. No. 4,226,898, Amorphous Semiconductors Equivalent To Crystalline Semiconductors, Stanford R. Ovshinsky and Arun Madan which issued Oct. 7, 1980 and by vapor deposition as fully described in U.S. Pat. No. 4,217,374, Stanford R. Ovshinsky and Masatsugu Izu, which issued on Aug. 12, 1980, under the same title. As disclosed in these patents, fluorine introduced into the amorphous silicon semiconductor operates to substantially reduce the density of the localized defect states therein and facilitates the addition of other alloying materials, such as germanium.

The concept of utilizing multiple cells, to enhance photovoltaic device efficiency, was discussed at least as early as 1955 by E. D. Jackson, U.S. Pat. No. 2,949,498 issued Aug. 16, 1960. The multiple cell structures therein discussed utilized p-n junction crystalline semiconductor devices. Essentially the concept is directed to utilizing different band gap devices to more efficiently collect various portions of the solar spectrum and to increase open circuit voltage (Voc). The tandem cell device has two or more cells with the light directed serially through each cell, with a large band gap material followed by one or more smaller band gap materials to absorb the light passed through the preceeding cell or layer.

It is of great commercial importance to be able to mass produce photovoltaic devices. Unlike crystalline silicon which is limited to batch processing for the manufacture of solar cells, amorphous silicon alloys can now be deposited in multiple layers over large area substrates to form solar cells in a high volume, continuous processing system. Continuous processing systems of this kind are disclosed, for example, in the following U.S. patents and pending patent applications: U.S. Pat. No. 4,400,409 issued 8/28/1983 for A Method of Making P-Doped Silicon Films And Devices Made Therefrom; Ser. No. 244,386, filed Mar. 16, 1981 for Continuous Systems For Depositing Amorphous Semiconductor Material; U.S. Pat. No. 4,410,558, issued 10/18/1983 for Continuous Amorphous Solar Cell Production System; Ser. No. 306,146, filed Sept. 28, 1981 for Multiple Chamber Deposition And Isolation System And Method; and Ser. No. 359,825, filed Mar. 19, 1982 for Method And Apparatus For Continuously Producing Tandem Amorphous Photovoltaic Cells. As disclosed in these applications, a substrate formed from stainless steel, for example, may be continuously advanced through a succession of deposition chambers, wherein each chamber is dedicated to the deposition of a specific material.

In making a solar cell of p-i-n type configuration, the first chamber is dedicated for depositing a p-type amorphous silicon alloy, the second chamber is dedicated for depositing an intrinsic amorphous silicon alloy, and the third chamber is dedicated for depositing an n-type amorphous silicon alloy. Since each deposited alloy, and especially the intrinsic alloy must be of high purity, the deposition environment in the intrinsic deposition chamber is isolated from the doping constituents within the other chambers to prevent the diffusion of doping constituents into the intrinsic chamber. In the previously mentioned patent applications, wherein the systems are primarily concerned with the production of photovoltaic cells, isolation between the chambers is accomplished by gas gates through which unidirectional gas flow is established and through which an inert gas may be "swept" about the web of substrate material.

In the previously mentioned patent applications, deposition of the amorphous silicon alloy materials onto the large area continuous substrate is accomplished by glow discharge decomposition of the process gases. Among these processes, radio frequency energy glow discharge processes have been commonly suggested as being suitable for the continuous production of photovoltaic devices. Radio frequency glow discharge processes however suffer from relatively slow deposition rates and low utilization of the reaction gas feed stock which are important considerations from the standpoint of making photovoltaic devices from these materials on a commerical basis. In addition, these processes result in high electron temperature plasmas which produce, during deposition, high densities of ions. The production of these ions results in ion bombardment of the materials as they are being deposited which can result in material damage.

A new and improved process for making amorphous semiconductor alloys and devices has recently been discovered which avoids the foregoing mentioned problems. This process is disclosed in copending application Ser. No. 423,424, filed Sept. 24, 1982 for Method Of Making Amorphous Semiconductor Alloys And Devices Using Microwave Energy. This process utilizes microwave energy to decompose the reaction gases to cause the deposition of improved amorphous semiconductor materials. This process provides substantially increased deposition rates and reaction gas feed stock utilization. The process further results in depositions from plasmas with lower electron temperatures and substantially reduced ion densities and hence, substnatially reduced ion bombardment and damage of the deposited materials. Microwave glow discharge processes can also be utilized to make layered structures as also disclosed in application Ser. No. 435,068, filed Oct. 18, 1982, for Method And Apparatus For Making Layered Amorphous Semiconductor Alloys Using Microwave Energy, now abandoned in favor of its divisional application U.S. Ser. No. 565,033, filed 12/23/83;

While these processes have proven successful in the laboratory, they cannot be easily applied to the high volume mass production of photovoltaic devices. The systems disclosed in the aforementioned referenced applications are not suitable for depositing amorphous semiconductor materials onto large area substrates. Furthermore, the disclosed systems are not adapted for the producton of such devices on a substrate which is continuously moved through a plurality of deposition chambers. It is to the solution of these problems and the continuous or batch production of amorphous semiconductor large area photovoltaic devices that the present invention is most particularly directed.

SUMMARY OF THE INVENTION

The invention provides an apparatus for manufacturing photovoltaic devices of the type including a plurality of layers of semiconductor materials deposited onto a substrate. The apparatus includes a plurality of deposition chambers, each chamber arranged to deposit a respective one of the layers of semiconductor materials onto the substrate as the substrate is advanced therethrough. The apparatus further includes a source of microwave energy, coupling means coupling the microwave energy source into at least one of the deposition chambers, and means for introducing reaction gases including at least one semiconductor containing compound into the at least one deposition chamber to form a microwave energy excited glow discharge plasma within the at least one deposition chamber for depositing a layer of semiconductor material onto the substrate from the microwave energy excited glow discharge plasma within the at least one deposition chamber.

The invention further provides an assembly for depositing a material onto a substrate from a microwave energy excited plasma. The assembly includes a deposition chamber, a source of microwave energy, and an antenna extending into the chamber and coupled to the microwave energy source. The antenna includes an outer sheath formed from a conductive material, an inner conductor extending within and electrically insulated from the outer sheath, and a slot within the outer sheath. The assembly can also include a new and improved feed-through for the antenna permitting the antenna to extend into the chamber while establishing a vacuum seal between the chamber and the antenna.

DETAILED DESCRIPTION OF THE DRAWINGS

I. The Photovoltaic Cell

Figure 1:
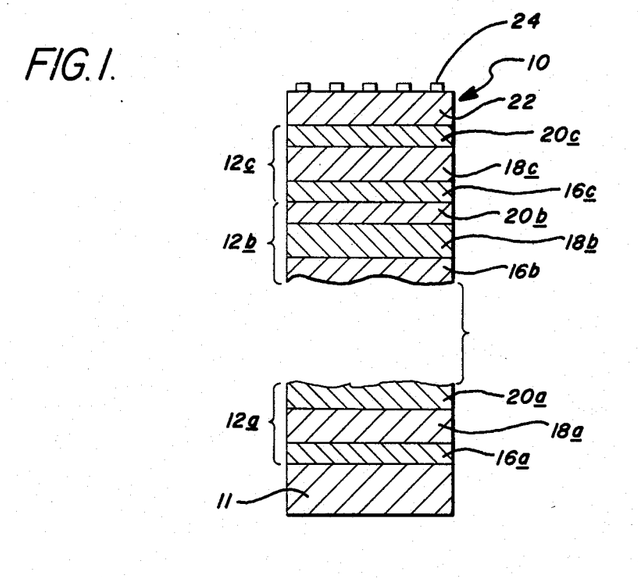
FIG. 1 is a fragmentary, cross-sectional view of a fully processed tandem or cascade photovoltaic device comprising a plurality of p-i-n type cells, each layer of the cells formed from an amorphous semiconductor alloy.

Referring now to the drawings and particularly to FIG. 1, a photovoltaic cell, formed of a plurality of successive p-i-n layers, each of which includes an amorphous semiconductor alloy, is shown generally by the numeral 10. It is for the production of this type of photovoltaic device, wherein amorphous alloy layers are continuously deposited onto a moving web of substrate material in successive isolated deposition chambers, that the present invention is particularly applicable.

More particularly, FIG. 1 shows a p-i-n type photovoltaic device such as a solar cell made up of individual p-i-n type cells 12a, 12b and 12c. Below the lower most cell 12a is a substrate 11 which may be preferably formed from a conductive metallic material such as stainless steel, aluminum, tantalum, molybdenum or chrome. The substrate can also include a nonconductive base having a layer or layers of conductive material deposited thereon. For purposes of this application, the term "substrate" shall include both rigid and flexible substrates and also any conductive layers added thereto by preliminary processing.

Each of the cells 12a, 12b and 12c is fabricated with an amorphous alloy semiconductor region or body containing at least a silicon alloy. Each of the alloy bodies includes an n-type conductivity region or layer 20a, 20b and 20c; an intrinsic region or layer 18a, 18b and 18c; and a p-type conductivity region or layer 16a, 16b and 16c. As illustrated, cell 12b is an intermediate cell and, as indicated in FIG. 1, additional intermediate cells may be stacked atop the illustrated cells without departing from the spirit or scope of the present invention. Also, although p-i-n cells are illustrated, the short circuit detecting and eliminating system of this invention may also be applied to produce single or multiple n-i-p cells as well.

Following the deposition of the semiconductor alloy layers, a further deposition process may be performed either in a separate environment or as a part of a continuous process. In this step, a transparent or semitranspatent layer 22 of conductive light transmissive material such as a TCO (transparent conductive oxide) of, for example, an alloy of indium, tin, and oxygen (ITO) is added. An electrode grid 24 may be added to the device where the cell is of a sufficiently large area, or if the conductivity of the TCO layer 22 is insufficient. The grid 24 shortens the carrier path and increases the collection efficiency.

II. The Multiple Glow Discharge Deposition Chambers

Figure 2:
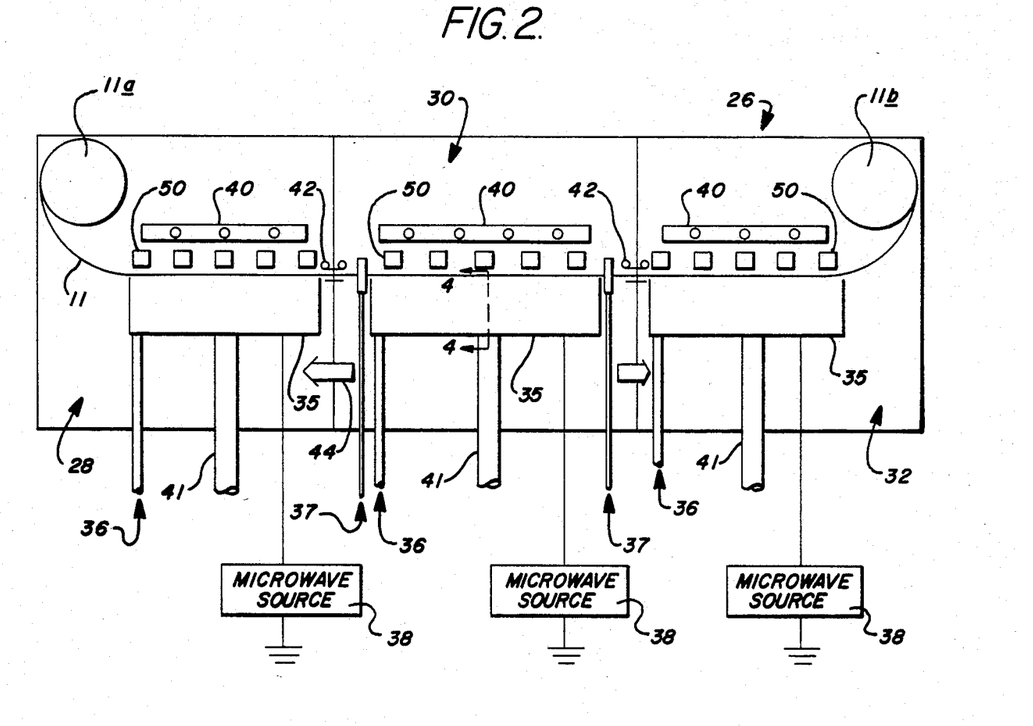
FIG. 2 is a diagrammatic representation of a multiple glow discharge chamber deposition system embodying the present invention adapted for the continuous production of the photovoltaic device shown in FIG. 1.

Turning now to FIG. 2, a diagrammatic representation of a multiple glow discharge chamber deposition apparatus embodying the present invention for the continuous production of photovoltaic cells is generally illustrated by the reference numeral 26. The continuous deposition apparatus 26 represents only a preferred embodiment of the present invention. The present invention can also be applied to or incorporated in a batch processing deposition apparatus as well without departing from the present invention. The apparatus 26 includes a plurality of isolated, dedicated deposition chambers, each chamber of which is interconnected by a gas gate through which sweep gases and a web of substrate material are adapted to unidirectionally pass.

The apparatus 26 is adapted to produce a high volume of large area, amorphous photovoltaic cells having a p-i-n configuration on the deposition surface of a substrate material 11 which is continually fed therethrough. To deposit the amorphous alloy layers required for producing multiple p-i-n type layer cells, the apparatus 26 includes at least one triad of deposition chambers. Each triad comprises: a first deposition chamber 28 in which a p-type conductivity amorphous alloy layer is deposited onto the deposition surface of the substrate 11 as the substrate 11 passes therethrough; a second deposition chamber 30 in which an intrinsic amorphous alloy layer is deposited atop the p-type alloy layer on the deposition surface of the substrate 11 as the substrate 11 passes therethrough; and a third deposition chamber 32 in which an n-type conductivity alloy layer is deposited atop the intrinsic layer on the deposition surface of the substrate 11 as the substrate 11 passes therethrough. Although, only one triad of deposition chambers has been illustrated, as disclosed in the aforementioned application Ser. No. 359,825, additional triads or additional individual chambers may be added to the apparatus to provide the machine with the capability of producing photovoltaic cells having any number of amorphous p-i-n type layers. The substrate supply core 11a and the substrate take-up core 11b are shown in the deposition chambers for illustrative purposes only. In reality the cores would be housed in separate chambers operatively connected to the deposition chambers.

Each deposition chamber 28, 30 and 32 of the triad is adapted to deposit a single amorphous silicon alloy, by microwave glow discharge deposition onto the conductive substrate 11. To that end, each of the deposition chambers 28, 30 and 32 includes: a shield 35; a gas supply conduit 36; an inert sweep gas conduit disposed on opposed sides of the intrinsic deposition chamber; microwave energy sources or generators 38; a plurality of transversely extending magnetic elements 50; an out gassing conduit 41; a plurality of radiant heating elements shown schematically as 40; and a gas gate 42 operatively connecting the intrinsic deposition chamber to each of the dopant chambers.

The supply conduits 36 are operatively associated with the respective shields 35 to deliver process gas mixtures to the plasma regions created in each deposition chamber between the shields 35 and the substrate 11. The shields 35, as will be more clearly seen hereinafter, are adapted to operate in conjunction with the web of substrate material 11 and the out gassing conduit 41 to substantially confine the plasma between the shields 35 and the substrate 11.

The microwave energy generators 38 operate in conjunction with antennas extending into the deposition chambers between the shields 35 and the substrate 11, the radiant heaters 40 and the grounded substrate 11 to form the plasma regions by dissociating the elemental reaction gases entering the deposition chambers into deposition species. The deposition species are then deposited onto a surface of the substrate 11 as amorphous semiconductor layers.

The microwave energy generators 38 operate at a microwave frequency of, for example, 2.45 Gigahertz. During deposition, the heaters 40 heat the substrate to about 350° C. and the chambers are maintained at about 0.1 Torr of pressure. The reaction gases fed into the gas supply conduits include at least one semiconductor containing compound such as silane ($SiH_4$) or silicon tetrafluoride ($SiF_4$). These gases can be used individually or can be combined as desired. To these gas mixtures hydrogen and/or argon gas can also be added. To deposit the doped layers, suitable dopant gases, such as diborane gas ($B_2H_6$) for p-type material, or phosphine gas ($PH_3$) for n-type material can also be added.

To form the photovoltaic cell 10 illustrated in FIG. 1, a p-type amorphous silicon layer is deposited onto the substrate 11 in the deposition chamber 28, an intrinsic amorphous silicon alloy layer is deposited atop the p-type layer in the deposition chamber 30 and an n-type amorphous silicon alloy layer is deposited atop the intrinsic layer in the deposition chamber 32. As a result, the apparatus 26, deposits at least three amorphous silicon alloy layers onto the substrate 11 wherein the intrinsic layer deposited in deposition chamber 30 differs in composition from the layers deposited in deposition chambers 28 and 32 by the absence of at least one element which will be referred to as the dopant or doping species.

It is important that each of the alloy layers (and particularly the intrinsic layer) deposited onto a surface of the substrate 11 be of high purity in order to produce high efficiency photovoltaic devices 10. The gas gates 42 substantially prevent the back diffusion of process gases from the dopant chambers into the intrinsic deposition chamber.

III. The Microwave Glow Discharge Deposition Chambers

Figure 3:
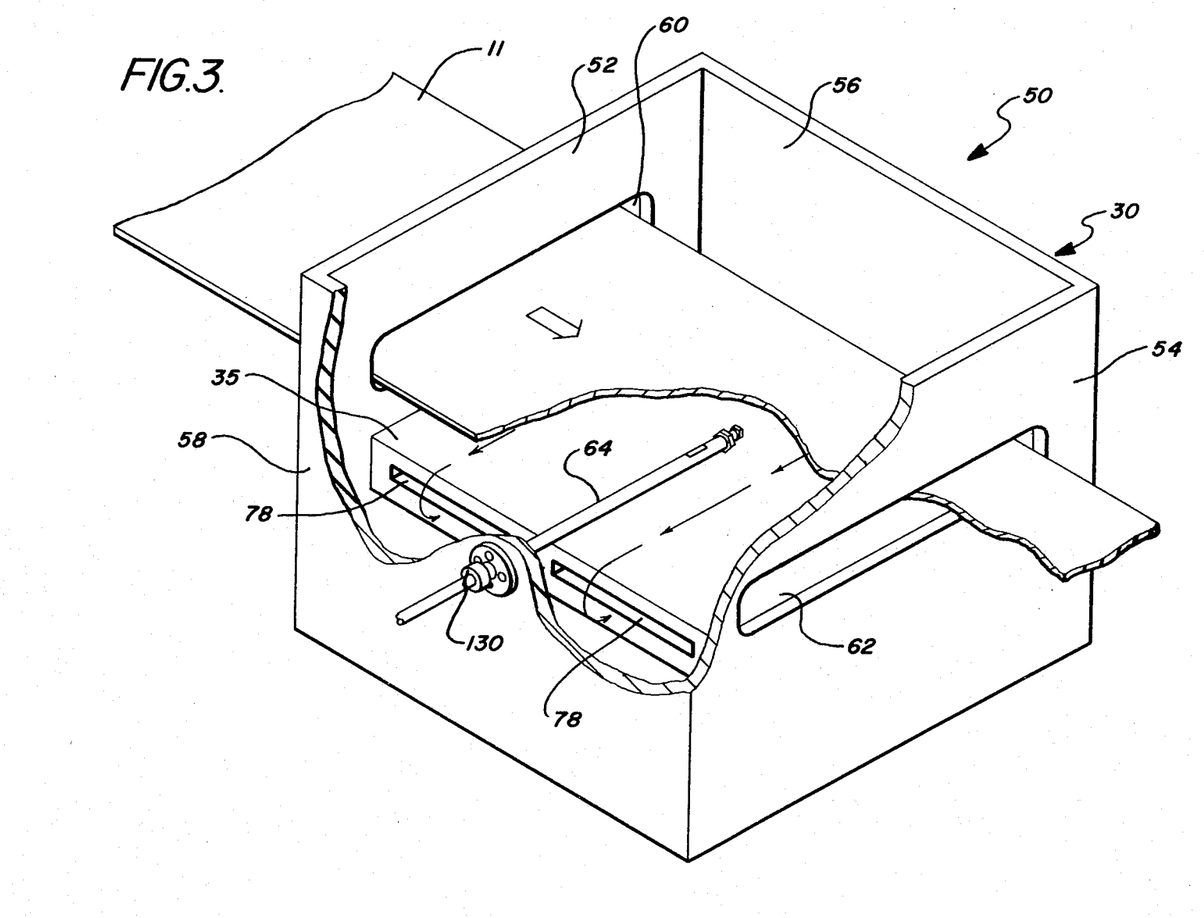
FIG. 3 is a cross-sectional view taken along lines 3—3 of FIG. 2.

Referring now to FIG. 3, it illustrates an assembly 50 adapted for the microwave glow discharge deposition of a material onto a substrate 11. The assembly 50, for purposes of this preferred embodiment directed to the manufacture of amorphous semiconductor photovoltaic devices, is the intrinsic deposition chamber 30 of FIG. 2. As will be understood, the chambers 28 and 32 can be substantially identical in general construction. Also, the magentic elements 50 and heating elements 40 are not illustrated in FIG. 3 for purposes of clarity.

The chamber 30 generally includes opposed sidewalls 52 and 54, a backwall 56, and a front wall 58. The sidewalls 52 and 54 include slots 60 and 62 respectively which are dimensioned to permit the substrate web 11 to pass through the chamber 28 as shown. The slots 60 and 62 are also dimensioned for being coupled to gas gates as previously referred to with respect to FIG. 2.

Beneath the substrate 11, and disposed across the chamber between the sidewalls 52 and 54 is the shield 35. Extending into the chamber 30 through the front wall 58 is an antenna assembly 64. The antenna assembly 64 is disposed between the substrate 11 and shield 35 and is spaced from the substrate 11 by about 1.5 inches.

Figure 4:
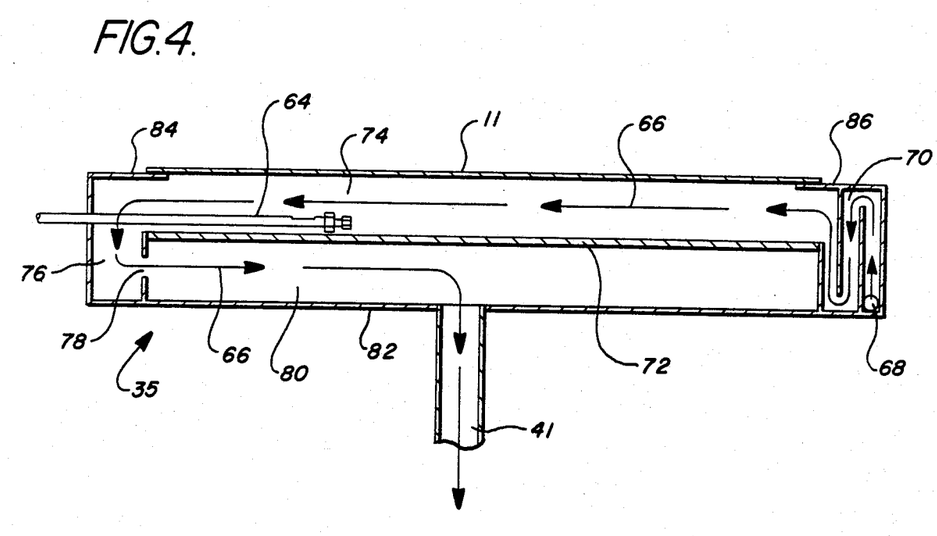
FIG. 4 is a perspective view, with portions broken away, of a microwave glow discharge deposition assembly embodying the present invention.

FIG. 4 illustrates the shield 35 in greater detail. As can be seen in FIG. 4, the shield 35 defines a flow pattern indicated by arrows 66 for the reaction gases. The gas supply conduit is coupled to the shield at an inlet port 68. The reaction gases are mixed in a mixing chamber or manifold 70 and then the mixed gases flow between the substrate 11 and a top planar member 72 of the shield. The gases flow across the substrate 11 and planar member 72 and enter a region 74 of microwave energy radiation which is coupled thereto by the antenna assembly 64 from a microwave energy source, such as sources 38 of FIG. 2. In this region 74 the microwave energy causes a plasma to be formed resulting in the deposition of a semicondcutor layer onto the substrate 11. The unused or spent gases after leaving the plasma region 74 continue through an exit passage 76, through a plurality of slots 78, into a passage 80 between the top planar member 72 and a bottom wall 82, and then out the out gassing conduit 41. This flow pattern is maintained by a pump connected to the out gassing conduit 41 which maintains the proper internal pressure for the deposition.

Although not illustrated in FIG. 3 for purposes of clarity, the shield 35 also includes a pair of extensions 84 and 86 from which the substrate 11 is closely spaced. As a result, the shield 35 confines the plasma formed by the reaction gases and the microwave energy to the region between substrates 11 and the shield 35. Also, as can also be seen in FIG. 3, the shield maintains even flow distribution of the reaction gases across the substrate 11 and thereafter, directs the unused gases through the slots 78 to be thereafter out gassed through the out gassing conduit 41 without being inadvertently mixed with the fresh reaction gas mixture entering the chamber 30.

Figures 5, 6:
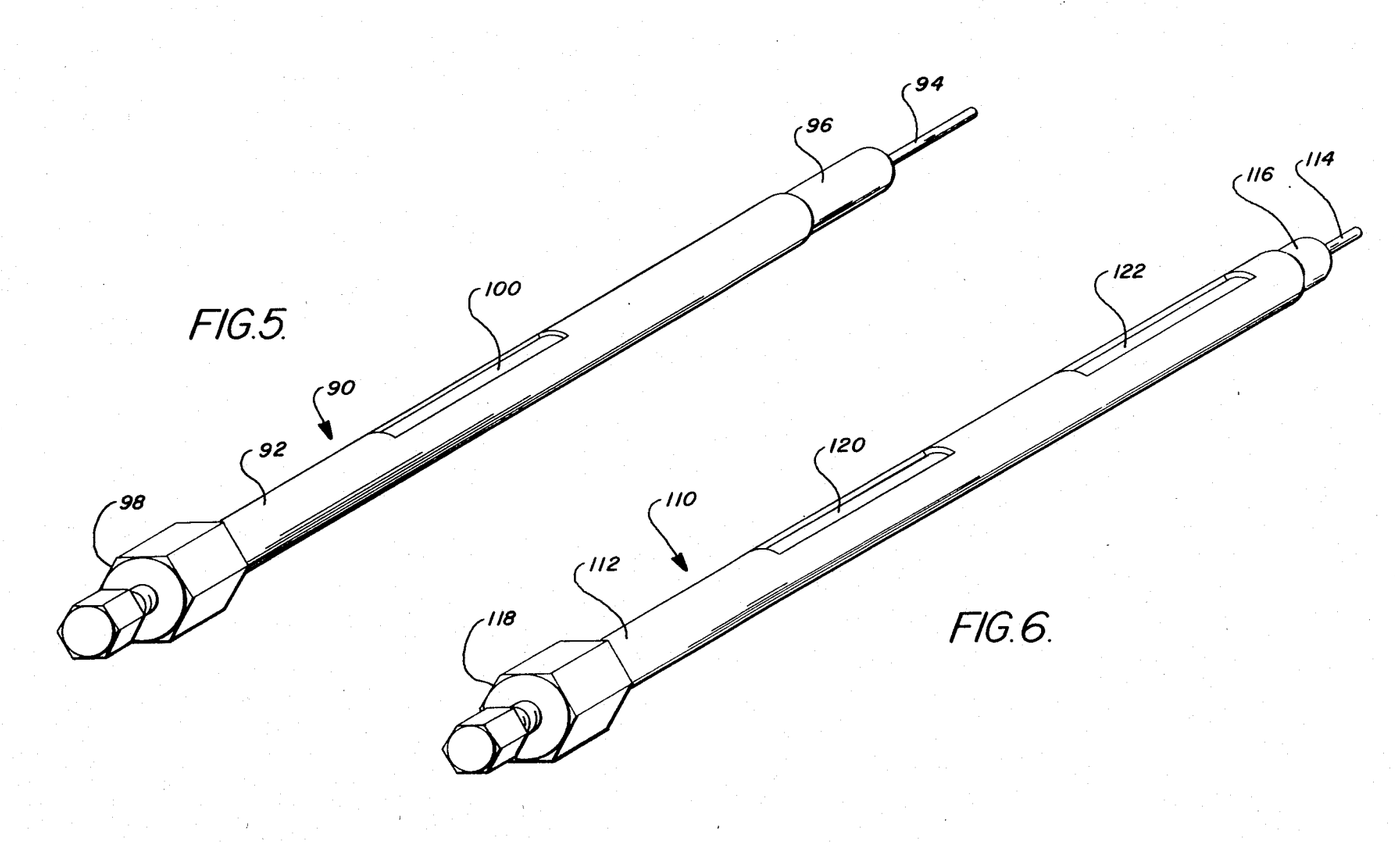
FIG. 5 is a perspective view of an antenna which can be utilized to couple microwave energy into a deposition chamber in accordance with the present invention.
FIG. 6 is a perspective view of another antenna embodying the present invention.

Referring now to FIG. 5, it illustrates in perspective view an antenna assembly 90 embodying the present invention. The antenna assembly includes an outer sheath 92 formed from rigid or semi-rigid electrically conductive material such as annealed copper tubing. Within the sheath, and extending across its entire length is a center conductor 94 which can be formed from silver plated copper. The interior of the sheath 92 is densely packed with an insulating material 96, such as teflon, which maintains the center conductor in proper insulated position with respect to the sheath. The teflon is in intimate contact with both the inner center conductor 94 and the interior surface of the outer sheath precluding the reaction gases from diffusing from one end of the antenna to the other. Thus, as will be seen in greater detail hereinafter, this antenna construction allows effective sealing techniques to be used when mounting the antenna assembly in place for use within the deposition chambers. Because the outer sheath can be formed from semi-rigid material, it can be bent at will and without loss to position the same for operation as desired.

The antenna assembly 90 also includes an end fitting 98 which establishes a short circuit connection at the end of the assembly between the sheath 92 and the center conductor 94. Lastly, a slot 100 is provided in the outer sheath 92. This provides microwave energy, coupled between the outer sheath 92 and the center conductor 94 at the unshorted end, to radiate over a desired area. Preferably, the slot 100 has a longitudinal length about eqaul to one-quarter wavelength for the desired operating microwave frequency and is narrow (about 0.01 to 0.1 inch) compared to one-quarter wavelength. The center of slot 100 is also preferably spaced from the shorted end by a distance about equal to three-quarters of a wavelength. Because slot 100 is narrow compared to a quarter wavelength and because the radiated energy is dissipated in the area of the antenna in a region much smaller than a wavelength, the plasma within the chamber is modeless. This removes system geometry constraints and provides for uniform deposition onto the substrate in the area of the plasma.

FIG. 6 illustrates another antenna assembly 110 embodying the present invention. It is substantially similar to the antenna assembly 90 of FIG. 5 in having an outer sheath 112, a center coductor 114, an insulating packing 116, a short circuit coupling 118, and a slot 120. In addition to the foregoing however, the assembly 110 includes a second slot 122. This second slot 122 permits the antenna assembly to radiant microwave energy over a broader area than the assembly 90 of FIG. 5. In actual practice, any number of slots can be provided to provide radiation of microwave energy over as broad an expanse as required. However, it is preferred that the slots be about of the same longitudinal length as the first slot 120 (one-quarter wavelength) and have their centers spaced apart by a distance of about one-half wavelength.

Figure 7:
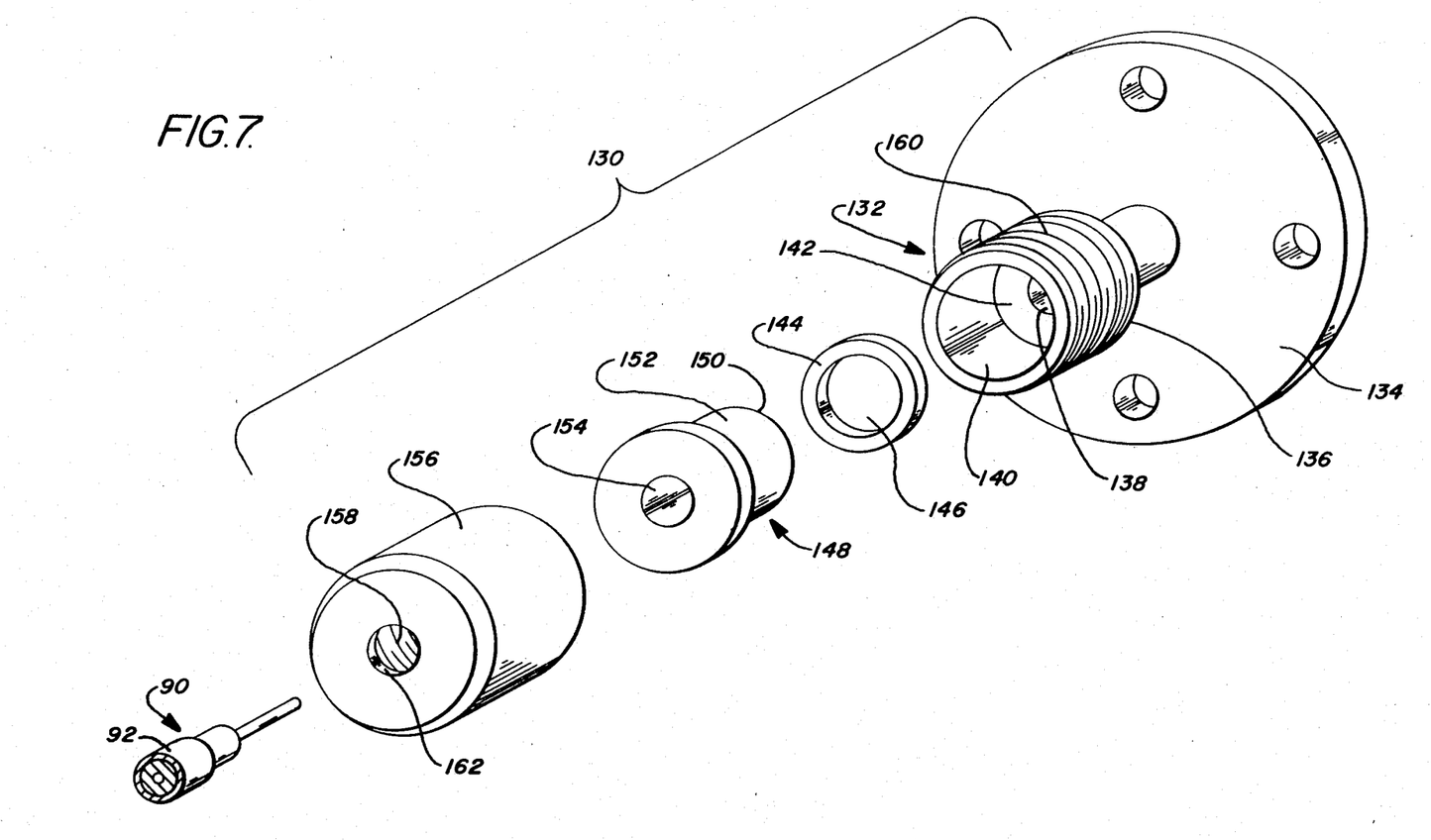
FIG. 7 is an exploded perspective view of a feed-through arrangement permitting the antenna of FIGS. 5 or 6 to extend into a deposition chamber while establishing a vacuum seal between the antenna and chamber in accordance with the present invention.

Referring again to FIG. 3, it can be noted that the antenna assembly 64 is mounted to the front wall 58 of the chamber 30 by a feed-through 130. The feed-through must not only permit adjustment of the position of the slot of the antenna but also must provide an effective vacuum seal between the antenna outer sheath and the opening (not shown) in the front wall 58 through which the antenna assembly extends. FIG. 7 illustrates in exploded view such a feedthrough 130.

The feed-through 130 generally includes a fitting 132 having an integral enlarged mounting plate 134 and an extension 136 extending therefrom. The extension 136 has an opening or passageway 138 dimensioned to permit the antenna assembly to pass therethrough and an enlarged counterbore 140. The passage 138 and counterbore 140 form an annular flange or seat surface 142. The feed-through 130 also includes a resilient ring-shaped member 144 dimensioned for being received into the counterbore 140 against the flange 142. The ring 144 has a center aperture 146 having a diameter large enough to permit the outer sheath of the antenna assembly to pass therethrough. A first cylindrical or spool-shaped member 148 having an annular surface 150 has an end 152 dimensioned to be received within the counterbore 140 so that the annular surface 150 can engage the ring member 144. The member 148 also has an axial passage 154 dimensioned for receiving the antenna assembly. Lastly, a second cylindrical member 156 has an inner dimension to be received over the member 148. The interior wall of the member 156 has a thread 158 arranged to threadingly engage the outer thread 160 of extension 136 and an opening 162 to permit the antenna assembly to pass therethrough.

In operation, the antenna assembly, such as assembly 90, prior to receiving its short circuit coupling 98, is fed through the openings or passages of each of the feed-through components. The ring 144 is then inserted into the counterbore 140 and placed against the flange or seat 142. Next, the member 148 is inserted into the counterbore 140 so that its annular surface 150 touches the ring 144. The member 156 is then threadingly engaged with the extension 136 and turned. As the member 156 is turned, it bears against the member 148 which in turn applies a compressive force to the ring 144 which is between the annular surface 150 and seat 142. The member 156 is turned or rotated sufficiently so that the compressive force exerted on the ring 144 causes the ring to deform radially inwardly and outwardly. As a result, the ring is urged into sealing engagement with both the inner wall of counterbore 140 and the outer sheath 92 of the antenna assembly to provide an effective vacuum seal. If after installation it is required to adjust the position of the antenna assembly, the member 156 need only be loosened allowing the adjustment to be made and then retightened. This effective vacuum seal feed-through arrangement is made possible because the outer sheath 92 of the antenna assembly 90 is formed from rigid or semi-rigid material.

Figure 8:
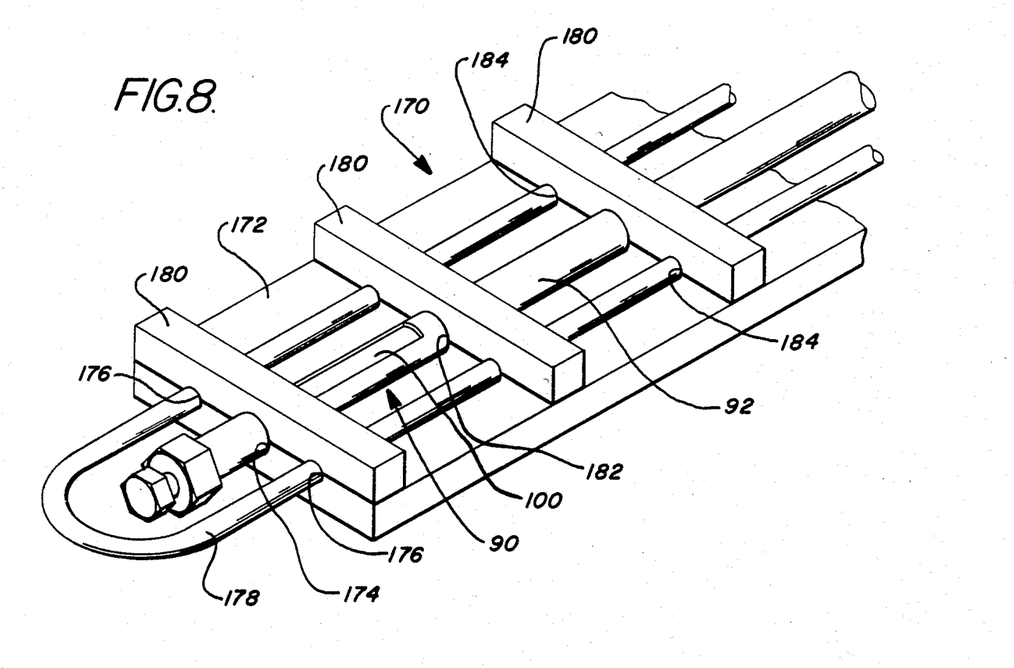
FIG. 8 is a perspective view of a cooling block assembly which can be utilized for cooling the antenna during operation in accordance with the present invention.

As previously mentioned, during the deposition of the amorphous semiconductor materials in making a photovoltaic device, the substrate is heated to about 350° C. This heating, together with the heat generated at the antenna, may be excessive. As a result, the antenna cooling assembly 170 of FIG. 8 can be utilized to cool the antenna assembly during its operation. The cooling assembly 170 includes a block or base 172 formed from a material having good thermal conductivity such as aluminum. The block has a center large diameter slot 174 dimensioned to receive the outer sheath 92 of the antenna assembly and a pair of small diameter slots 176 dimensioned to receive a copper tubing 178. A plurality of spaced apart hold-down clamps 180 are provided with corresponding slots 182 and 184 to securely clamp the assembly together. The clamps 180 can be secured to the block 172 with screws or the like in any convenient manner. The clamps are spaced apart so that none of the clamps overlies a slot 100 in the outer sheath 92. The copper tubing 178 during operation is provided with a flow of cold water which cools the block 72. The block 72 then in turn cools the antenna assembly 90.

By virtue of the present invention, microwave glow discharge can now be utilized in the manufacturing of large area photovoltaic devices. Such manufacture can be either by batch processing of continuous processing as disclosed in the preferred embodiment. Each component of the apparatus adds to this achievement. For example, the antenna assembly of the present invention can be made at low cost and doesn't rely on expensive waveguide techniques. The antenna assembly can be readily fabricated to any desired configuration without power loss. Only heat resistant materials are utilized and thus the antenna can withstand high temperature. Should cooling be required, the present invention provides an effective and efficient means to cool the antenna. Should the presence of copper near the glow discharge prove harmful, the antenna assembly and copper tubing of the cooling assembly if used can be electroplated with nickel, for example, in a straight forward manner. Also, since the microwave energy is radiated from a small slot, the power density at that location is very high making the antenna assembly self-cleaning. Lastly, because the microwave energy is radiated through a relatively narrow slot and because the radiated energy is dissipated in the area of the antenna in a region much smaller than a wavelength, the plasma within the chamber is modeless. As a result, system geometry constraints are overcome.

The present invention also provides an effective feed-through arrangement. This arrangement not only facilitates ready antenna position adjustment, but effective and efficient vacuum sealing.

Lastly and most importantly, the apparatus of the present invention is capable of depositing amorphous semiconductor materials over large area substrates. This allows microwave energy to be effectively utilized in the manufacture of photovoltaic devices either by continuous or batch processing with all of the concomitant advantages of microwave glow discharge deposition processes including increased deposition rates and improved quality of deposited materials.

The alloy regions other than the intrinsic alloy regions can be other than amorphous regions, such as polycrystalline regions. (By the term "amorphous" is meant an alloy or material which has long range disorder, although it may have short or intermediate order or even contain at times some crystalline inclusions.)

Modifications and variations of the present invention are possible in light of the above teachings. It is therefore, to be understood that within the soope of the appended claims the invention may be practiced otherwise than as specifically described.

What is claimed and desired to be secured by Letters Patent of the United States is:

1. An apparatus for manufacturing photovoltaic devices of the type including at least one layer of semiconductor material deposited onto a substrate; said apparatus comprising:
   a source of substrate material;
   at least one deposition chamber, said chamber arranged to deposit said layer of semiconductor material onto said substrate as said substrate is advanced therethrough;
   a source of microwave energy;
   means for continuously advancing said substrate material through said at least one deposition chamber;
   coupling means coupling said microwave energy into said at least one deposition chamber, said coupling means comprising an antenna contained within said at least one deposition chamber; and
   means for introducing reaction gases including at least one semiconductor containing compound into said at least one deposition chamber to form a microwave energy excited glow discharge plasma within said at least one deposition chamber for depositing a layer of semiconductor material onto said substrate from the microwave energy excited glow discharge plasma within said at least one deposition chamber.

2. An apparatus for manufacturing photovoltaic devices of the type including a plurality of layers of semiconductor materials deposited onto a substrate; said apparatus comprising:
   a plurality of depositing chambers, each said chamber arranged to deposit a respective one of said layers of semiconductor materials onto said substrate as said substrate is advanced therethrough;
   a source of microwave energy;
   coupling means coupling said microwave energy into at least one of said deposition chambers, said coupling means comprising an antenna contained within said at least one deposition chamber, said antenna including means for forming a modeless microwave energy excited glow discharge plasma within said at least one deposition chamber; and
   means for introducing reaction gases including at least one semiconductor containing compound into said at least one deposition chamber to form a microwave energy excited glow discharge plasma within said at least one deposition chamber for depositing a layer of semiconductor material onto said substrate from the microwave energy excited glow discharge plasma within said at least one deposition chamber.

3. An apparatus as defined in claim 2 wherein said antenna comprises an outer sheath formed from conductive material, an inner conductor within said outer sheath and electrically insulated from said outer sheath, and a slot within said outer sheath.

4. An apparatus as defined in claim 3 wherein said slot within said outer sheath extends longitudinally along said outer sheath.

5. An apparatus as defined in claim 4 wherein the width dimension of said slot is narrow compared to a wavelength of said microwave energy.

6. An apparatus as defined in claim 5 wherein said slot has a length dimension of about one-quarter wavelength for the microwave frequency of said microwave source.

7. An apparatus as defined in claim 6 further including an insulating material filling the interior of said outer sheath and making intimate contact with said inner conductor and the interior surface of said outer sheath.

8. An apparatus as defined in claim 3 further comprising cooling means for cooling said antenna.

9. An apparatus as defined in claim 8 wherein said cooling means comprises a water cooled block of thermally conductive material contacting said antenna outer sheath.

10. An apparatus as defined in claim 1 further including means coupling microwave energy into each of said deposition chambers and means for introducing reaction gases including at least one semiconductor containing compound into each said deposition chamber for depositing a layer of semiconductor material onto said substrate from a microwave energy excited glow discharge plasma within each said deposition chamber.

11. An apparatus as defined in claim 1 further comprising a plurality of said deposition chambers for depositing a plurality of layers of semiconductor materials.

12. An assembly for depositing a material onto a substrate from a microwave energy excited plasma, said assembly comprising: a deposition chamber; a source of microwave energy; and an antenna extending into said chamber and coupled to said microwave energy source, said antenna including an outer sheath formed from conductive material, an inner conductor extending within and electrically insulated from said outer sheath, and a slot within said outer sheath.

13. An assembly as defined in claim 12 wherein said slot within said outer sheath extends longitudinally along said outer sheath.

14. An apparatus as defined in claim 13 wherein the width dimension of said slot is narrow compared to a wavelength of said microwave energy.

15. An assembly as defined in claim 14 wherein said slot has a length dimension of about one-quarter wavelength for the microwave frequency of said microwave source.

16. An assembly as defined in claim 15 further including an insulating material filling the interior of said outer sheath and making intimate contact with said inner conductor and the interior surface of said outer sheath.

17. An assembly as defined in claim 12 further comprising cooling means for cooling said antenna.

18. An assembly as defined in claim 17 wherein said cooling means comprises a water cooled block of thermally conductive material contacting said antenna outer sheath.

19. An assembly as defined in claim 18 further comprising a thermally conductive tube contacting said block and adapted to conduct water therethrough for water cooling said block and said outer sheath.

20. An assembly as defined in claim 12 wherein said deposition chamber includes at least one wall having an opening dimensioned to permit said antenna to extend therethrough, and wherein said assembly further includes antenna feed-through means including a fitting adapted to be secured to said chamber wall, said fitting having an axial passage aligned with said chamber wall opening and having an annular flange and an inner surface, a resilient ring-shaped member dimensioned to be received within said passage against said flange, said passage and said ring being dimension to permit said antenna to pass therethrough, and compressive force applying means for applying a compressive force to said resilient ring to cause said ring to radially inwardly and outwardly deform into sealing engagement with the outer surface of said antenna sheath and said inner surface of said passage for providing a vacuum seal feed-through for said antenna.

21. An assembly as defined in claim 20 wherein said fitting further includes an outer thread, and wherein said compressive force applying means comprises a first cylindrical member having an annular surface adapted to engage said resilient ring-shaped member on the side thereof opposite said flange, and a second cylindrical member having an inner thread adapted to threadingly engage said fitting outer thread for urging said first cylindrical member against said resilient ring-shaped member for applying said compressive force to said resilient ring-shaped member.

22. An assembly as defined in claim 21 wherein said first and second cylindrical members include an axial passage aligned with said fitting passage for permitting said antenna to extend therethrough and into said chamber.

* * * * *